Jan. 21, 1964 E. S. SCHLIG ETAL 3,119,076

SUPERCONDUCTIVE AMPLIFIER

Filed May 29, 1959 3 Sheets-Sheet 1

INVENTORS
EUGENE S. SCHLIG
JOHN J. LENTZ

BY Frederick J. Smyth
ATTORNEY

Jan. 21, 1964 E. S. SCHLIG ETAL 3,119,076

SUPERCONDUCTIVE AMPLIFIER

Filed May 29, 1959 3 Sheets-Sheet 3

United States Patent Office 3,119,076

Patented Jan. 21, 1964

3,119,076

SUPERCONDUCTIVE AMPLIFIER

Eugene S. Schlig, New York, and John J. Lentz, Chappaqua, N.Y., assignors to International Business Machines Corporation, New York, N.Y., a corporation of New York Filed May 29, 1959, Ser. No. 816,762
4 Claims. (Cl. 330—62)

This invention relates to superconductive devices and more particularly to an improved superconductive amplifier.

The phenomenon of superconductivity, that is the ability of certain materials to exhibit zero electrical resistance below certain critical temperatures, has been known for a great number of years, and has been applied to the design of electrical circuits. Generally, superconductive electrical circuits consist of a plurality of first elements, or gate conductors, and a plurality of second elements, or control conductors, each of which are fabricated of superconductive material. Current flow through selected control conductors generates magnetic fields which when applied to associated gate conductors are effective to destroy superconductivity therein, and these gate conductors then exhibit normal electrical resistance. By interconnecting gate and control conductors, various electrical circuits have been developed including superconductive amplifier circuits.

Superconductive amplifiers, according to the prior art, have been constructed by applying a magnetic field to a gate conductor to bias this conductor at a particular operating point in the transition region between the superconducting and resistive states. The magnitude of this field is selected so that, at the operating temperature of the circuit, the gate conductor is no longer superconducting, yet the magnitude of the applied field is not sufficient to drive the gate conductor fully into the normal resistive state. An associated control conductor is then caused to vary the resultant magnetic field applied to the gate, thereby varying the resistance of the gate conductor. Superconductive amplifiers of this type are described in copending applications Serial No. 677,239, filed August 9, 1957, on behalf of D. R. Young, now Patent No. 3,015,041, and Serial No. 782,706, filed December 24, 1958, on behalf of R. M. Walker and E. S. Schlig, now Patent No. 3,020,489, each of which has been assigned to the assignee of this application.

Generally, control conductors have been employed to generate the magnetic fields which determine the resistance of the gate conductor, but it has been noted that superconductivity in the gate conductor can be destroyed by the current conducted by the gate itself. That is, in the absence of an applied magnetic field, there is a particular current value, known as the critical current conducted by the gate above which it is not possible to maintain the gate in a superconducting state. A text entitled "Superconductivity," by D. Schoenberg, published in 1952 by the Cambridge University Press of London, England, discusses such critical current on pages 10, 41, 133, 134, 174 etc. of the text. Such critical current is also referred to as the Silsbee effect or Silsbee current and sets out the maximum current a superconductor can carry before its self-current drives the superconductor resistive.

Recently, novel superconductive circuits have been developed which do not depend on a magnetic field itself to control the resistance of a gate conductor, rather the resistance of the gate conductor is controlled by controlling the critical current of the gate conductor. This novel principle and circuits developed therefrom are described in copending application Serial No. 809,818, filed April 29, 1959, on behalf of J. J. Lentz and D. J. Dumin, and assigned to the assignee of this application. Basically, these novel circuits include a control element, known as a guard strip, to control the critical current of a gate element, known as a gate strip. This gate strip and associated guard strip are fabricated one above the other and extend longitudinally in the same direction. Initially, the action of the guard strip is similar to the effect of a superconducting shield, that is the value of critical current in the gate strip is increased by a factor of almost two. Next, current flow through the control strip is effective to modify the value of critical current about this increased value. Current flow in a first direction is effective to increase the value of critical current, while current flow in a second direction is effective to decrease it.

What has been discovered is a novel circuit employing this principle useful in superconductor amplifiers. The amplifier embodiment of the invention employs a pair of gate strips operated in parallel and fed from a source of constant current. In the absence of an applied signal, current divides between the gate strips in a predetermined ratio. When signals are applied to a pair of guard strips, the critical current value of a first gate strip is increased and that of a second gate strip is decreased to thereby effect a shift of a portion of the current flowing through the first strip into the second gate strip, in accordance with the magnitude of current flowing through the guard strips. Since the amount of current shifted can be greater than the magnitude of current flowing through the guard strips, amplification is possible. Additionally, a novel current reservoir circuit is incorporated in the amplifier embodiment of the invention to ensure that the predetermined operating conditions are maintained when no signal is applied to the amplifier, yet allows the hereinbefore described current shift to occur when signals are applied to the amplifier.

Additional features of the amplifier of the invention include operation wherein no power is consumed under steady state conditions, as well as operation at speeds comparable to other thin film devices.

An object of the invention is to provide an improved superconductive amplifier.

Another object of the invention is to provide a superconductive amplifier wherein no energy is dissipated during steady state conditions.

Still another object of the invention is to provide a superconductive amplifier wherein input signals are effective to modify the critical current value of a pair of superconducting current paths in such manner that a portion of the current flowing in a first path is shifted into a second path.

Yet another object of the invention is to provide a superconductive amplifier including a novel circuit to stabilize the operation of the amplifier.

A further object of the invention is to provide an improved superconductive amplifier wherein operating conditions are established essentially independent of the operating temperature.

Another object of the invention is to provide a superconductive amplifier employing novel gating devices.

The foregoing and other objects, features and advantages of the invention will be apparent from the following more particular description of preferred embodiments of the invention, as illustrated in the accompanying drawings.

Figure 1:
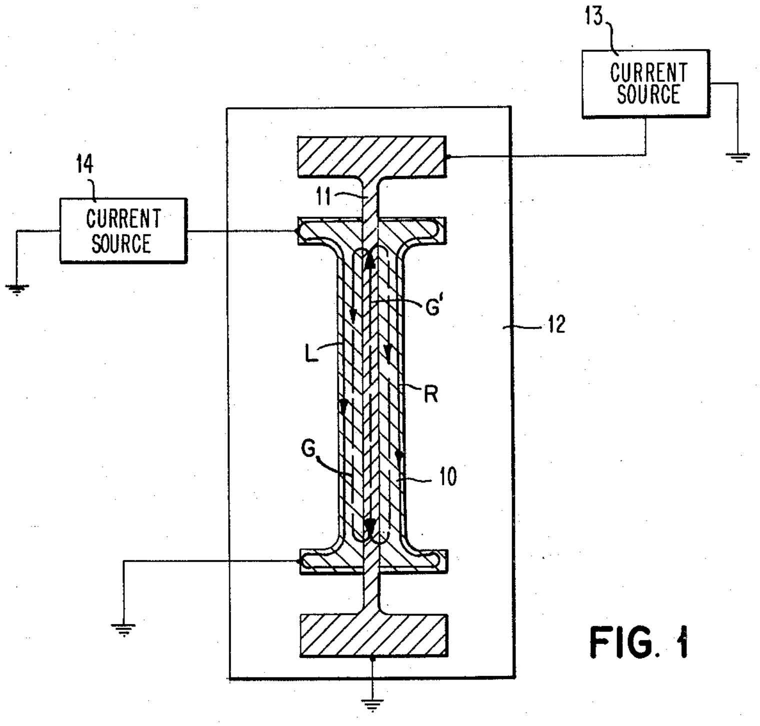
FIG. 1 is a diagrammatical representation of a gating device useful in the circuits of the invention.

FIG. 1 is a schematic representation of a thin film gating device shown and described in the above referenced copending application Serial No. 809,818 and useful in the circuits of the subject invention. As shown in FIG. 1, the gating device includes a gate strip 10 and a guard strip 11 separated by a layer of insulating material and mounted on a planar surface 12. In conventional superconductive gating devices, the gate element is selectively driven resistive by a magnetic field generated by current flow through an associated control element. However, in the superconductive gating device of FIG. 1 the influence of current flow through guard strip 11 modifies the critical current value of gate strip 10, that is the maximum value of current that the gate strip can conduct without driving itself resistive. In this manner, the gate strip is resistive depending on whether or not the value of current delivered by a constant current source 14 exceeds the instantaneous value of critical current.

As was discussed in more detail in the above-noted copending application Serial No. 809,818, current from current source 14 will flow in a thin superconductor strip 10 along the edges of such strip, such edge currents being labelled L and R. Current from current source 13 flows through guard strip 11 in the same direction that current from current source 14 flows in gate 10. Such current in guard strip 11 is identified as G. Current G induces a current G′ in gate strip 10, G′ being opposite to the direction of current flow G. The induced current G′ must flow in a closed loop in superconductive gate 10. This closed loop of current is, in effect, composed of two symmetrical closed loops, one is a left loop which flows down gate 10 to enhance the current L and then returns upon itself below the guard strip 11 that lies over the gate 10. The second closed loop of induced current flows in gate 10 to the right of the guard strip 11 and enhances gate current R before returning to complete the closed loop beneath guard strip 11. When the induced current is in a direction such as to add to the current flow in the gate, then the value of current from source 14 that the gate 10 can tolerate before going resistive is diminished. If the current in guard strip 11 flows in a direction opposite to that flowing in gate 10 beneath the guard strip, then the induced current G′ would flow in closed loops in gate 10 so that they oppose gate currents L and R. When such opposition takes place, the amount of current that the gate 10 can tolerate before it is driven resistive is increased.

Figure 2:
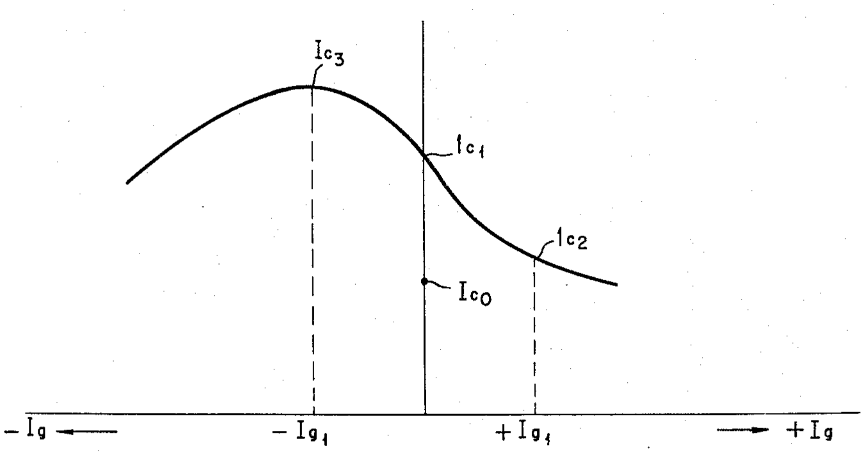
FIG. 2 is a curve illustrating the variation of critical current value in a gate strip as a function of the magnitude and direction of current flow through an associated guard strip.

This action of the gating device of FIG. 1 may best be understood with reference to FIG. 2 which shows the critical current, $Ic$, of a gate strip as a function of magnitude and direction of current flow, $Ig$, through an associated guard strip. In the following paragraphs, a positive sign is used to indicate that current flow through the guard strip is in the same direction as current flow through the gate strip and a negative sign is used to indicate that current flow through the guard strip is in a direction opposite to the direction of current flow through the gate strip. In the absence of a guard strip, the gate strip has a value of critical current $Ic_0$ as shown in FIG. 2. The addition of a guard strip, however, is effective to increase the critical current value of the gate strip to the value $Ic_1$, when no current flows through the guard strip. Current flow through the guard strip is now effective to alter the critical current value about the value $Ic_1$, in the following manner. When the guard strip conducts a current from a current source 13 having, by way of example, the magnitude and direction of $+Ig_1$, the value of the critical current of the gate strip is reduced from the value $Ic_1$ to $Ic_2$ as indicated in FIG. 2. Reversing the direction of current flow through the guard strip while maintaining the magnitude constant, that is $-Ig_1$, the critical current value of the gate strip then becomes $Ic_3$, which, as can be seen in FIG. 2, is greater than $Ic_1$. Thus, when current flows through the guard and gate strips in the same direction, the critical current value of the gate is reduced below the value thereof with no current flow in the guard strip. Conversely, when current flow through the guard and gate strips is in opposite directions, the value of the gate critical current is increased.

Figure 3:
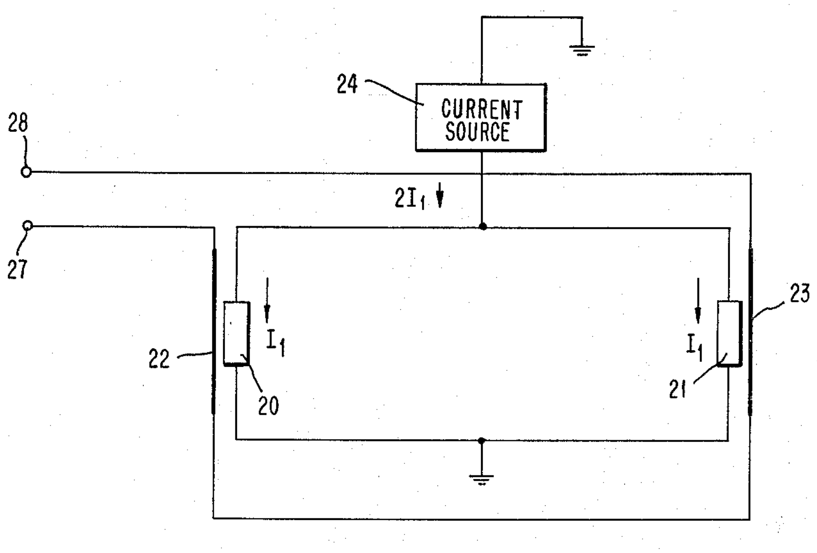
FIG. 3 is a schematic diagram illustrating an amplifier embodiment of the invention.
Figure 4:
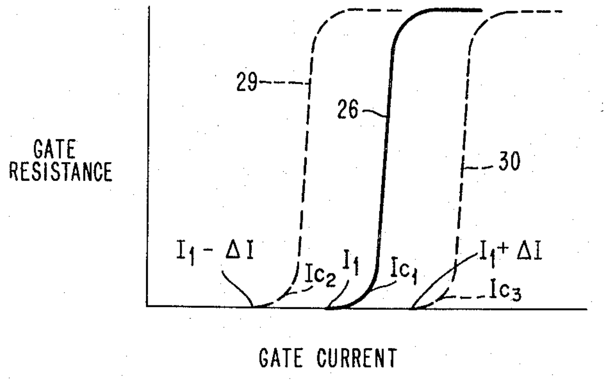
FIG. 4 is a family of curves illustrating the variation of the resistance exhibited by a gate strip as a function of current flowing therethrough.

An example of the use of gating devices illustrated in FIG. 1 in a superconductive amplifier is shown in the circuit of FIG. 3. In this figure, the gating devices are illustrated schematically, with 20 and 21 representing gate strips, and 22 and 23 representing their associated guard strips, respectively. As an aid in understanding the operation of the amplifier of FIG. 3, various limitations will at first be imposed, but as will be explained more particularly hereinafter, these are not necessary for proper operation of the circuit. Thus it will initially be assumed that each of the gate strips have the same value of critical current in the absence of current flow through the guard strips. Additionally, a constant current source 24 delivers a current to the parallel connected gate strips having a value $2I_1$, such that a current $I_1$ flows through each of the superconducting gate strips. Referring now to FIG. 4, curve 26 represents the resistance of a gate strip as a function of the current carried by the gate in the absence of current flow through an associated guard strip. The value of current carried by gates 20 and 21, $I_1$, is also indicated on curve 26 as being slightly below the value of the critical current, $Ic_1$, of the gate, and therefore each of the gate strips remains superconducting.

Operation of the circuit can be explained by considering current applied to terminals 27 and 28 having a magnitude equal to $Ig_1$ and a polarity such that current flows from terminal 27 to terminal 28. From the direction of current flow assumed, it will be seen that this current flow through guard strip 22 is in the same direction as current $I_1$ carried by gate 20 and thus corresponds to $+Ig_1$. However, this current flow through guard strip 23 is opposite to the direction of current $I_1$ carried by gate 21 and thus is effectively $-Ig_1$. For this reason, the critical current of gates 20 and 21 which, in the absence of current flow through the guard strips 22 and 23, was $Ic_1$, has been modified to the new values of $Ic_2$ in gate 20 and $Ic_3$ in gate 21. Thus gates 20 and 21 have the instantaneous resistance versus current curves 29 and 30 respectively as shown in FIG. 4. Since the value of $I_1$ is greater than the value of $Ic_2$, gate 20 becomes resistive and a portion of the current therethrough begins to shift into the superconducting path containing gate 21. This shift continues until the current carried by gate 20 has the value $I_1-\Delta I$ which is less than $Ic_2$ and the current carried by gate 21 has the value $I_1+\Delta I$ which is less than $Ic_3$, and both gates are again superconducting. In a similar manner, current will shift from the path including gate 21 to the path including gate 20 when the direction of current flow through the guard strips in reversed and current flows from terminal 28 towards terminal 27.

Figure 5:
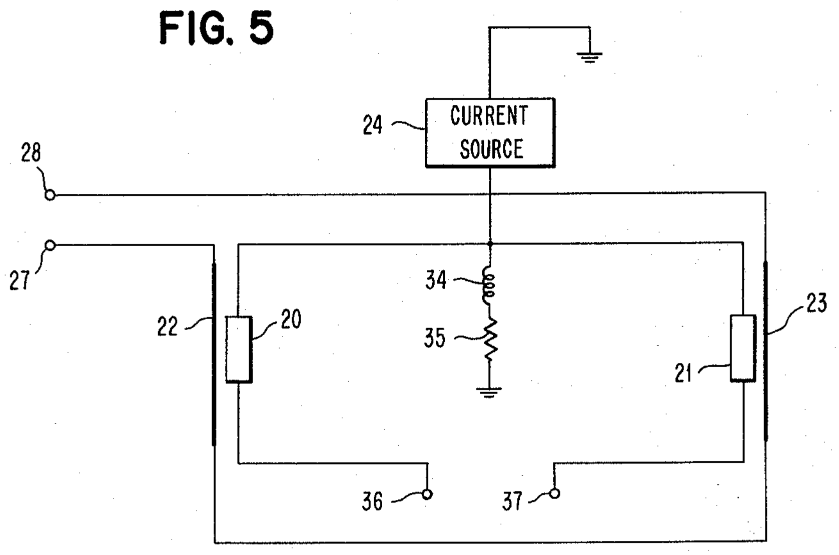
FIG. 5 is a schematic diagram illustrating a modified circuit of the embodiment shown in FIG. 3.

The amplifier circuit illustrated in FIG. 5 is a modification of the circuit of FIG. 3 wherein a novel current reservoir consisting of inductance 34 and resistance 35 has been added. The current reservoir is effective to compensate for differences in the value of critical current of gates 20 and 21 as well as variations in the current supplied by source 24 or the operating temperature. The action of the reservoir may be explained in the following manner. The value of inductance 34 is chosen to be relatively large as compared to the inductance in either of the parallel superconducting paths containing gates 20 and 21 in order to present an open circuit to high frequency signals and resistor 35 has a minute value in order to present an effective open circuit to low frequency signals. The current supplied to the circuit by source 24 is next adjusted to have a value slightly greater than the sum of the respective critical current values of gates 20 and 21. Thus, gates 20 and 21 will each carry a current equal to their respective critical currents, the value at which resistance just begins to appear. The remainder of the current from source 24 then flows through the reservoir. Changes in the critical current value of either or both gates as a result of a change in the operating temperature, by way of example, will automatically be compensated by the reservoir. More particularly, a decrease in operating temperature will result in each of the gate strips becoming completely superconducting and current will be shifted out of the reservoir into each of the gate paths until each gate again carries its new value of critical current and thus operates at the toe of the resistance versus current curve. Similarly, an increase in operating temperature will result in an increase in the resistance of each of the gate strips and current will shift out of the gate paths into the reservoir until each of the gates again carries its new value of critical current. Current applied to terminals 27 and 28 will again cause a current shift in the same manner as described above with reference to FIG. 3, and this current shift under control of guard strips 22 and 23 is not effected by the reservoir. This current shift is available at terminals 36 and 37 which may be connected to another superconductive circuit (not shown), which may be by way of example, of the types shown in the above referenced copending applications Serial Nos. 677,239, now Patent No. 3,015,041, and 782,706, now Patent No. 3,020,489. Additionally, if for any reason the critical current versus guard strip strip current, as illustrated in FIG. 2, is non-linear, so that the increase of critical current in a first strip differs from the decrease of critical current in a second guard strip, the difference will be compensated by the current reservoir as explained above.

Although the operation of the circuit of FIG. 5 differs from that of the circuit of FIG. 3 since a greater value of current is carried by each of the gates, it should be understood that the circuit of FIG. 3 could be operated with each gate carrying a current of $Ic_1$, instead of $I_1$. Additionally, each of the circuits of FIG. 3 and FIG. 5 could be operated with a further increase in the current conducted by the gate strips during quiescent conditions but it is preferred to operate in the manner described with reference to FIG. 3 and FIG. 5 to thereby reduce the power loss resulting from current flow through a resistive gate strip to a minimum.

Figure 6:
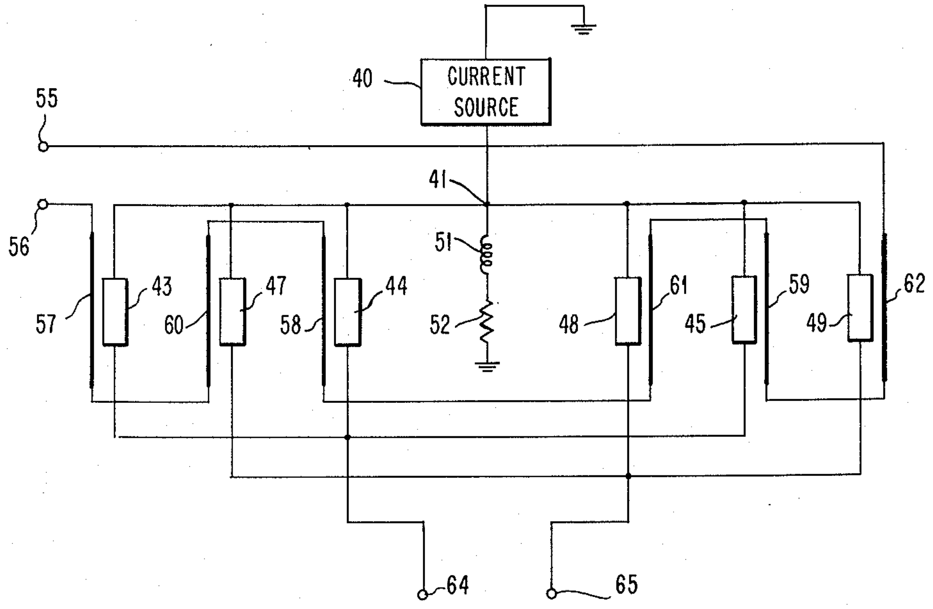
FIG. 6 is another embodiment of the amplifier of the invention.

Referring now to FIG. 6, there is shown a further embodiment of the amplifier of the invention wherein a plurality of pairs of gate strips are operated in parallel and each of the associated guard strips are electrically connected in series. In this manner, the gain of an amplifier stage can be increased. Current from source 40 is fed to junction 41 and thence by means of a pair of parallel paths to terminals 64 and 65. A first path includes the parallel connected gate strips 43, 44 and 45 and terminal 64. A second path includes the parallel connected gate strips 47, 48 and 49 and terminal 65. The current from source 40 has a magnitude slightly in excess of the sum of the critical current values of each of gate strips, and, as hereinbefore explained, each of the gate strips then operates at the toe of its resistance versus current curve by conducting a current equal in magnitude to its critical current and the excess current flows through the current reservoir consisting of inductance 51 and resistance 52. Signal current is next applied to terminals 55 and 56 to modify the critical current value of each of the gate strips. Assuming, by way of example, current flowing from terminal 56 towards terminal 55, it can be seen that this current flowing through guard strips 57, 58 and 59 is effective to lower the respective critical current values of gates 43, 44 and 45 and simultaneously flowing through guard strips 60, 61 and 62 is effective to increase the critical current of gates 47, 48 and 49. Thus current is shifted from the path containing gates 43, 44 and 45 into the path containing gates 47, 48 and 49. As before, this current shift is available at a pair of terminals 64 and 65. It will be understood that the gain of the amplifier of FIG. 6 is approximately equal to the gain of the amplifier of FIG. 5 multiplied by the number of gate pairs employed, and since three gate pairs are illustrated in FIG. 6, this circuit exhibits approximately three times the gain of the amplifier of FIG. 5.

Although each of the circuits herein described must be operated at a sufficiently low temperature, the method and apparatus thereby required have neither been shown nor described since they will be well known to one skilled in the art.

While the invention has been particularly shown and described with reference to preferred embodiments thereof, it will be understood by those skilled in the art that various changes in form and details may be made therein without departing from the spirit and scope of the invention.

What is claimed is:

1. A superconductive amplifier comprising; a current source; first, second, and third current paths electrically connected in parallel with said source; each of said first and second paths including at least a superconductive gate strip characterized by a predetermined value of critical current; means maintaining said amplifier at a temperature at which each of said gate strips is normally superconducting; said third path having at least an inductance of relatively large value and a resistance of relatively small value; said current source supplying a predetermined current to said paths; said predetermined current having a magnitude whereby each of said gate strips carries a current equal to its critical current value; and signal means coupled to said gate strips and adapted to conduct signal currents therethrough; said signal current flow through said signal means being effective to increase the critical current value of the gate strips in one of said paths and to simultaneously decrease the critical current value of the gate strips in the other of said paths.

2. A superconductive amplifier comprising a source of electrical current,
first and second superconductive means connected in parallel with said source,
said first and second means including first and second superconductive gate strips having first and second critical current values whereby either gate strip is driven resistive when it carries a current in excess of its critical current,
means maintaining said amplifier at a temperature at which each of said gate strips is superconducting,
said source supplying a predetermined current to said parallel connected superconductive means,
said predetermined current from said source normally dividing between said means with a first portion in said first means and a second portion said second means,
each of said portions being less than the critical current of either of said means,
a guard strip adjacent to the disposed parallel to each gate strip,
and signal means applied simultaneously to said guard strips for simultaneously increasing the critical current value of one gate strip due to current flowing in a first guard strip associated therewith and decreasing the critical current value of the second gate strip due to current flowing in the second guard strip associated therewith.

3. A superconductive amplifier comprising a current source,
first, second and third current paths electrically connected in parallel with said source, means maintaining said amplifier at a temperature at which each of said first and second current paths is normally superconducting, each of said first and second paths including a superconductive gate strip having a predetermined critical current value, said third path including a current reservoir, said current source supplying a predetermined current to said current paths, said current from said source normally dividing between said parallel paths whereby each of said first and second gate strips conducts a current equal to its critical current value and the excess of said predetermined current flows through the current reservoir, a guard strip arranged adjacent to and parallel to each gate strip, and means for sending current simultaneously through both guard strips for increasing the critical current value of one gate strip due to current flowing in a first guard strip associated therewith and decreasing the critical current value of the second gate strip due to current flowing in the second guard strip associated therewith.

4. A superconductive amplifier comprising a current source, first and second current paths, means connecting said first and second paths electrically in parallel, each of said first and second paths including first and second superconductive gate strips which exhibit a predetermined critical current value, means for maintaining said paths at a superconductive temperature, means conducting predetermined current from said source to said parallel connected first and second paths, said predetermined current dividing between said paths and each of said gate strips remaining superconducting during such division, signal means coupled to said gate strips and adapted to conduct signal current therethrough, said signal means including first and second guard strips of superconductive material extending longitudinally in the same direction as said first and second gate strips, respectively, means connecting said guard strips electrically in series, said current flow through one of said guard strips being in the same direction as current flow from said source through one of said gate strips and said signal current flow through the other of said guard strips being in the opposite direction to current flow from said source through the other of said gate strips, said signal current flow through said serially connected guard strips being thereby effective to lower the critical current value of one of said gate strips and to increase the critical current value of the other of said gate strips, whereby a portion of the current flowing through said one gate strip is shifted to said other gate strip and each of said gate strips remains superconductive.

References Cited in the file of this patent

UNITED STATES PATENTS

| | | |
|---|---|---|
| 2,832,897 | Buck | Apr. 29, 1958 |
| 2,913,881 | Garwin | Nov. 24, 1959 |
| 2,930,908 | McKeon et al. | Mar. 29, 1960 |
| 2,944,211 | Richards | July 5, 1960 |
| 2,966,598 | Mackay | Dec. 27, 1960 |

FOREIGN PATENTS

| | | |
|---|---|---|
| 975,848 | France | Dec. 20, 1947 |

OTHER REFERENCES

Publication—National Electronics Conf., vol. XIII, Oct. 7–9, 1957, pages 574–582 (see pages 580, 581 specifically).

Publication—Proceedings of the IRE, April 1956, pages 482–493 (see pp. 485, second column).

Garwin: IBM Journal, October 1957, pages 304–308.

UNITED STATES PATENT OFFICE

CERTIFICATE OF CORRECTION

Patent No. 3,119,076 January 21, 1964

Eugene S. Schlig et al.

It is hereby certified that error appears in the above numbered patent requiring correction and that the said Letters Patent should read as corrected below.

Column 6, line 63, for "the" read -- and --.

Signed and sealed this 23rd day of June 1964.

SEAL)
ttest:

RNEST W. SWIDER
testing Officer

EDWARD J. BRENNER
Commissioner of Patents